(12) United States Patent
Radius

(10) Patent No.: US 6,218,696 B1
(45) Date of Patent: Apr. 17, 2001

(54) LAYOUT AND WIRING SCHEME FOR MEMORY CELLS WITH VERTICAL TRANSISTORS

(75) Inventor: Roland Radius, Wappingers Falls, NY (US)

(73) Assignee: Infineon Technologies North America Corp.

( * ) Notice: Subject to any disclaimer, the term of this patent is extended or adjusted under 35 U.S.C. 154(b) by 0 days.

(21) Appl. No.: 09/326,889

(22) Filed: Jun. 7, 1999

(51) Int. Cl.[7] .................................................. H01L 27/108
(52) U.S. Cl. ........................ 257/302; 257/488; 438/248; 438/386
(58) Field of Search ..................................... 257/301, 302, 257/488; 438/243, 248, 386, 387, 388, 389, 390, 391, 392

(56) References Cited

U.S. PATENT DOCUMENTS 6,091,094 * 7/2000 Rupp ..................................... 257/296
6,093,614 * 7/2000 Gruening et al. ..................... 438/388

* cited by examiner

Primary Examiner—Olik Chaudhuri
Assistant Examiner—Ginette Peralta

(57) ABSTRACT

A memory device having vertical transistors in accordance with the present invention includes an active area pad isolated from adjacent active area pads on all sides and having a set of trench capacitors associated therewith. The set of trench capacitors are coupled to the active area pad through vertical transistors. The active area pad is configured to connect the set of trench capacitors to a first contact. A gate conductor pad is disposed between a set of active area pads and adapted to activate at least one vertical transistor in each active area pad adjacent to the gate conductor pad. Each gate conductor pad is activated by a second contact such that when the gate conductor pad is activated through the second contact the at least one vertical transistor in each active area pad conducts to provide access to the trench capacitors and transfers a state between the first contact and the trench capacitors.

20 Claims, 5 Drawing Sheets

LAYOUT AND WIRING SCHEME FOR MEMORY CELLS WITH VERTICAL TRANSISTORS

BACKGROUND

1. Technical Field

This disclosure relates to semiconductor layouts and more particularly, to a layout for semiconductor memory cells with vertical transistors.

2. Description of the Related Art

In semiconductor memory devices, gate conductors are formed through a memory array to activate access transistors for reading and writing to storage nodes disposed in deep trenches by charging or discharging the storage node. In prior art systems, access transistors are disposed on a surface of the chip and require a large amount of chip area. These memory cells with planar transistors are activated by a line conductor that forms a gate conductor for the planar transistor. The line width of this gate conductor was critical for these prior art memory cell designs since the line width also defined the gate length for the transistor.

Since the gate conductor (GC) typically has a high electrical resistance (it is generally formed from polysilicon and tungsten silicide), methods were implemented to improve usage of the gate conductor due to it high resistance. One way to address the high resistance of the gate conductor is to form a stitched or bridged pattern. The stitched pattern includes alternating the gate conductors between metal layers to bring the line resistance to a lower level. This reduces the line resistance to a tenth of the gate conductor value.

With the transition to vertical transistors to reduce layout area for memory cells, the gate conductor layer is only used for wiring purposes, and the gate conductor is no longer used to define the gate length. Therefore, the gate conductor width is no longer critical.

Therefore, a need exists for improved layouts and wiring schemes which take advantage of the gate conductor orientation for vertical transistors.

SUMMARY OF THE INVENTION

A memory device having vertical transistors in accordance with the present invention includes an active area pad isolated from adjacent active area pads on all sides, and having a set of trench capacitors associated therewith. The set of trench capacitors are coupled to the active area pad through vertical transistors. The active area pad is configured to connect the set of trench capacitors to a first contact. A gate conductor pad is disposed between a set of active area pads and adapted to activate at least one vertical transistor in each active area pad adjacent to the gate conductor pad. Each gate conductor pad is activated by a second contact such that when the gate conductor pad is activated through the second contact the at least one vertical transistor in each active area pad conducts to provide access to the trench capacitors and the active area pad transfers a state between the first contact and the trench capacitors.

A semiconductor memory having vertical access transistors includes a substantially square active area pad having a trench capacitor formed at each corner of the active area pad. The trench capacitors are coupled to the active area pad through vertical transistors. The active area pad is configured to connect the set of trench capacitors to a first contact when the vertical transistors are conducting. A substantially square gate conductor pad is disposed between four active area pads such that corners of the gate conductor pad overlap adjacent corners of the four active area pads. The gate conductor pad is adapted to activate one vertical transistor corresponding to the corner of each active area pad overlapped by the gate conductor pad. The gate conductor pad is activated by a second contact such that when the gate conductor pad is activated through the second contact, the one vertical transistor in each active area pad conducts to provide access to the trench capacitors and to transfer a state between the first contact and the trench capacitors.

Another semiconductor memory having vertical access transistors includes a plurality of substantially square active area pads. Each active area pad has a trench capacitor formed at each corner of the active area pad. The trench capacitors are coupled to the active area pad through vertical transistors. The active area pads are configured to connect the set of trench capacitors to a first contact when the vertical transistors are conducting. A plurality of substantially square gate conductor pads, each is disposed between four active area pads to form a checkerboard pattern between the gate conductor pads and the active area pads. Each of the gate conductor pads has corners overlapping adjacent corners of the four active area pads. Each corner of the gate conductor pad is adapted to activate one vertical transistor corresponding to the corner of each active area pad overlapped by the gate conductor pad. Each gate conductor pad is activated by a second contact such that when the gate conductor pad is activated through the second contact the one vertical transistor in each active area pad conducts to provide access to the trench capacitors and to transfer a state between the first contact and the trench capacitors. A first metal layer is connected to the first contacts, and a second metal layer is vertically spaced apart from the first metal layer. The second metal layer is connected to the second contacts for activating the gate conductor pads.

In alternate embodiments, the active area pads and the gate conductor pad may be one of square, circular and triangular in shape. The first contact preferably connects to a first metallization layer, and the second contact preferably connects to a second metallization layer. The first metallization layer preferably includes first metal lines, and the second metallization layer preferably includes second metal lines wherein the first metal lines and the second metal lines have a substantially equal pitch and are disposed in a zig-zag pattern. The active area pads and the gate conductor pads may be disposed in a checkerboard pattern. The first contact may be connected to a bitline and the second contact may be connected to a wordline. The device or memory is divisible into memory cells such that the memory cells may have an area of about $4F^2$ or about $6F^2$.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to memory cell layout and wiring for memory cells which include vertical transistors. The present invention provides embodiments having active area islands or pads connected by a gate conductor island or pad. The gate conductor island has a contact connection for connecting the gate conductor island to higher metal layers. Each active area island overlaps a portion of the gate conductor islands. The gate conductor islands are used to activate vertical transistors which, in turn, charge and discharge deep trench storage nodes. Further details of the present invention will become clear with the detailed description which follows.

Figure 1:
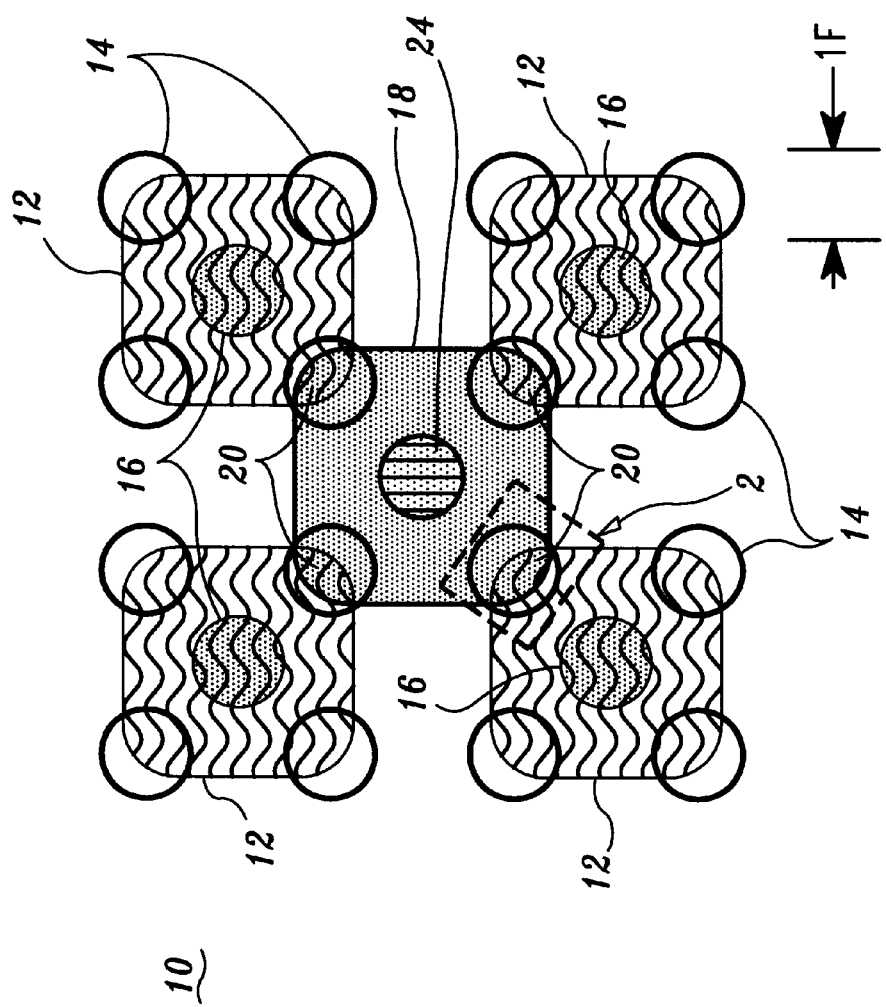
FIG. 1 is a top view of a layout pattern in accordance with one embodiment the present invention.

Referring now in specific detail to the drawings in which like reference numerals identify similar or identical elements throughout the several views, and initially FIG. 1, a top view of one illustrative embodiment of a semiconductor memory device 10 in accordance with the present invention is shown. Device 10 includes active areas 12 which include a source region for completing a conductive path to deep trenches 14 from an active area to metal layer contact 16. Active areas 12 are pads or islands each having a contact 16. Each contact 16 preferably connects to active area 12 which, in turn, provides access to four deep trenches 14. Deep trenches 14 are disposed at corners of active areas 12. However, other active area shapes are envisioned and may be capable of accessing larger or smaller numbers of deep trenches.

Disposed between active areas 12 are gate conductor (GC) pads or islands 18. GC pads 18 include portions 20 which overlap active areas 12. In the embodiment shown in FIG. 1, GC pads 18 and active areas 12 are rectangular, and preferably square in shape, and GC pads 18 and active areas 12 overlap at the corners. Other shapes may be employed and are contemplated by the present invention. For example, active areas and GC pads may be circular or triangular in shape. GC pads 18 and active areas 12 are preferably disposed in a checkerboard pattern.

Figure 3:
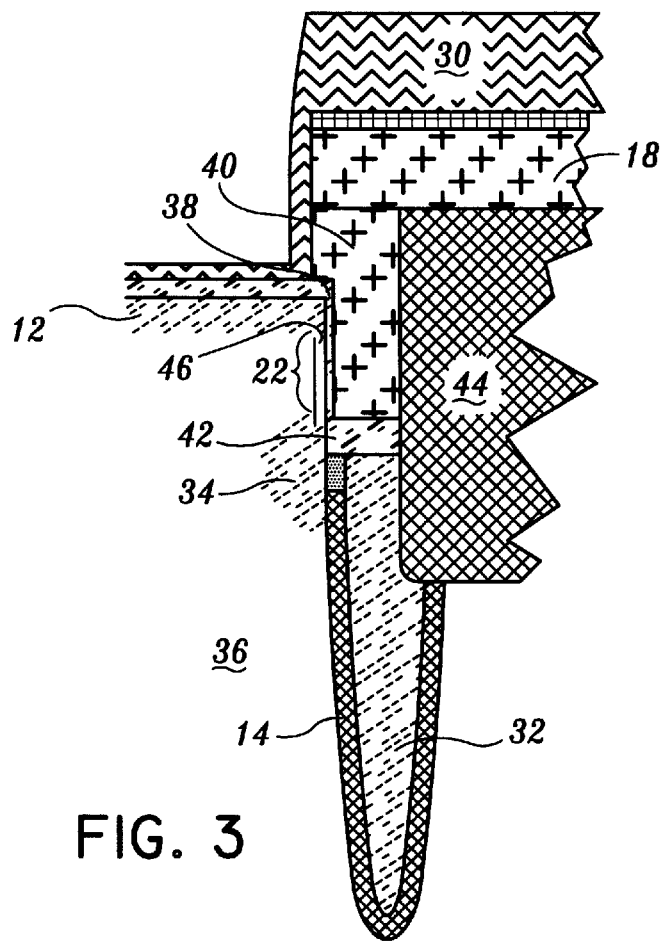
FIG. 3 is a cross-sectional view taken at section lines 3—3 of FIG. 2 showing a vertical transistor for the present invention.

Each GC pad 18, in this embodiment, activates four vertical transistors 22 (see FIG. 3). A contact 24 connects GC pad 18 to a higher metal layer, for example M0 or M1 (See FIG. 5). In this way, GC pad 18 receives a voltage through contact 24. This activates vertical transistors 22 which are adjacent to the activated GC pad 18. Data from a bitline (not shown) which is connected to contact 16 may now be stored or recalled from deep trenches 14 through vertical transistors 22.

Figure 2:
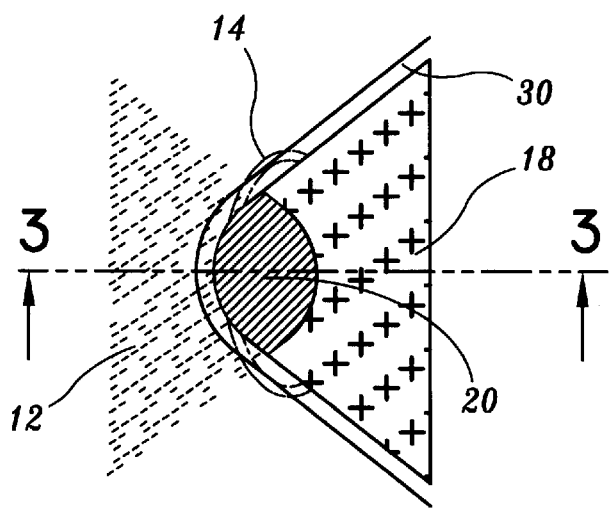
FIG. 2 is a magnified view of the area shown in FIG. 1 and indicated as area 2 in accordance with the present invention.

Referring to FIG. 2, a magnified view of area 2 of FIG. 1 is shown in greater detail. GC pad 18 and active area 12 overlap at portion 20. Deep trench 14 extends into the page below GC pad 18 and active area 12. A gate insulator material 30 surrounds GC pad 18 to prevent current leakage.

Referring to FIG. 3, a view of a cross-section taken at section line 3—3 in FIG. 2 is shown. Deep trench 14 includes a storage node 32 which is accessed through a buried strap 34. Buried strap 34 is separated from active area 12 by a portion of a substrate 36. This region is essentially a channel 46 for vertical transistor 22. A gate oxide 38 separates a portion 40 the gate conductor from channel 46. Portion 40 is connected to GC pad 18. Portion 40 is isolated from storage node 32 by a trench top isolation layer 42. A trench isolation 44 (e.g., shallow trench isolation) may also be employed.

When GC pad 18 is activated, portion 40 applies a potential to permit conduction through channel 46. This permits charging or discharging of storage node 32 depending on whether the operation is a read or write operation and based on the data to be stored or discharged.

Figure 4:
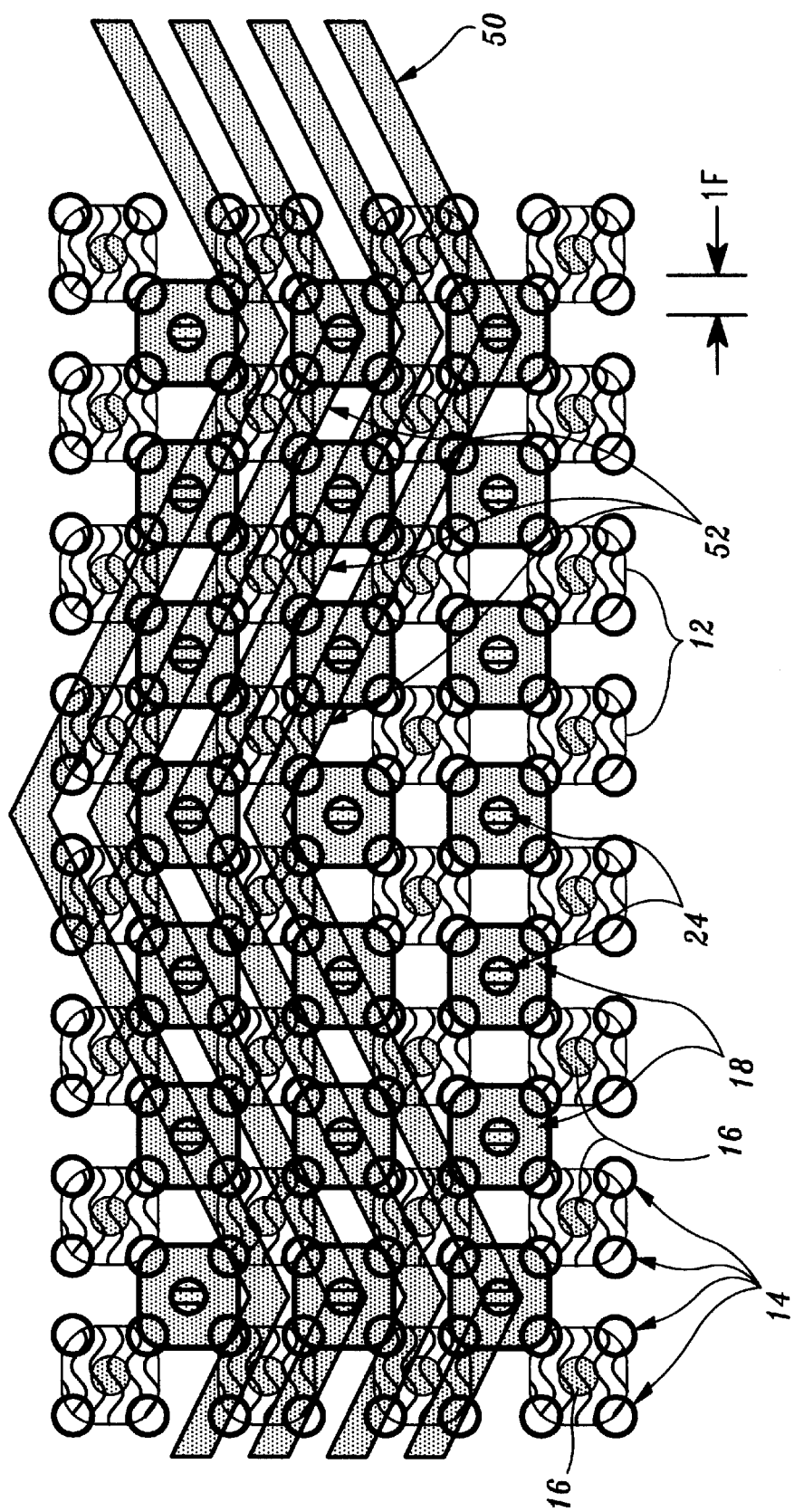
FIG. 4 is a layout of one embodiment of the present invention showing an M1 metallization layer for accessing gate conductors in accordance with the present invention.

Referring to FIG. 4, a layout and partial wiring scheme is shown in accordance with the present invention. GC pads 18 and active areas 12 are shown in a larger layout area. In a preferred embodiment, deep trenches 14 include a minimum feature size F and are circular in shape. A metallization layer 50 is shown for connecting to contacts 24 which connect to GC pads 18. Metallization layer 50 may include metal lines 52 arranged in a zig-zag pattern, or alternately in a straight line pattern. The pattern shown in FIG. 4 illustratively shows only four metal lines 52, however, the pattern continues across device 10. For clarity, no metal lines for connecting to contacts 24 are shown. This is shown in FIG. 5.

Figure 5:
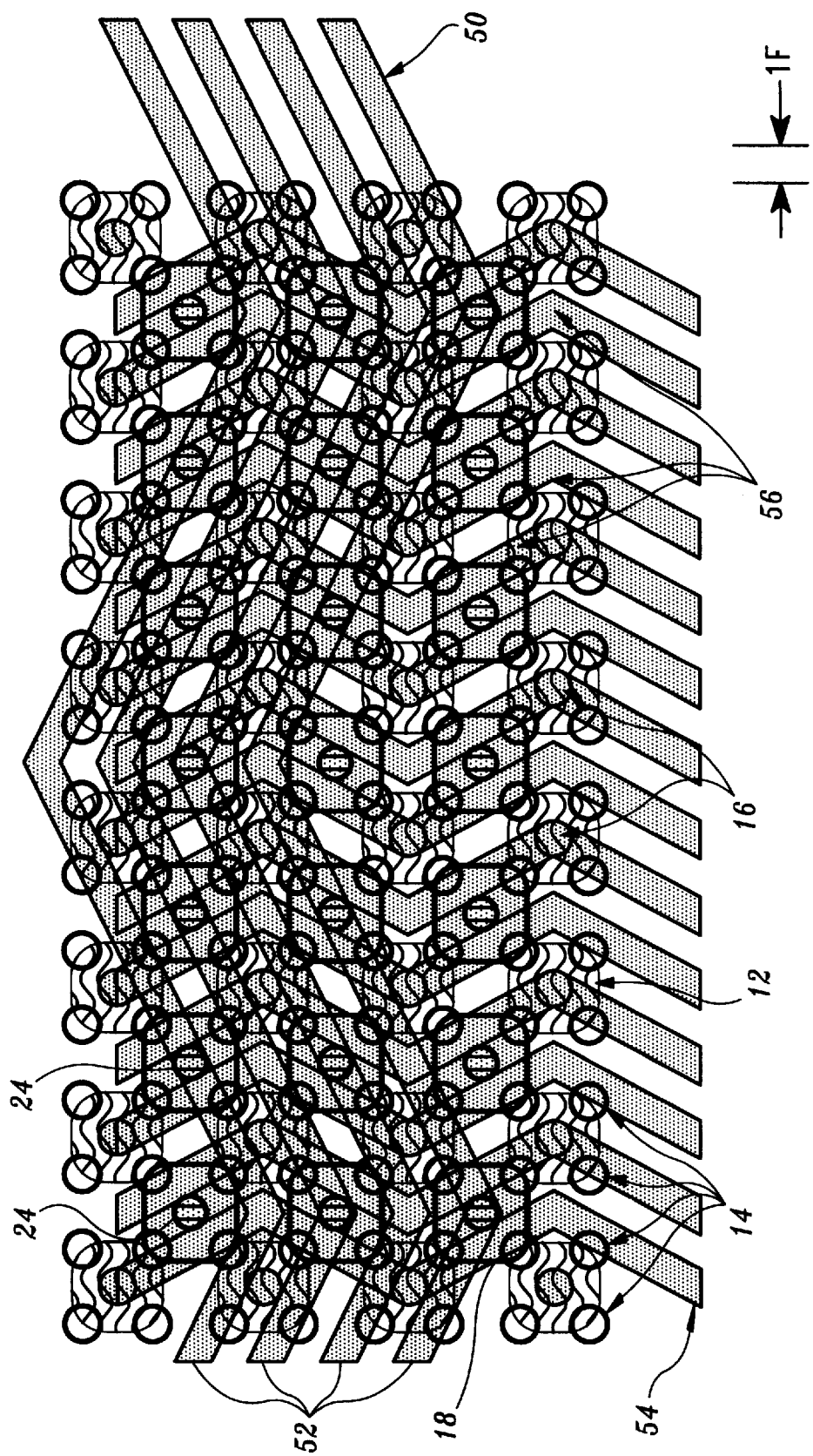
FIG. 5 is the layout of FIG. 4 showing an M0 metallization layer for transferring data states between deep trenches in accordance with the present invention.

Referring to FIG. 5, a layout and partial wiring scheme is shown in accordance with the present invention. GC pads 18 and active area pads 12 are shown in a $4F^2$ pattern where F is a minimum feature size for the given technology. In a preferred embodiment, deep trenches 14 include a minimum feature size F and are circular in shape. Metallization layer 50 is shown for connecting to contacts 24 which connect to GC pads 18. Metallization layer 50 may include metal lines 52 arranged in a zig-zag pattern, or alternately in a straight line pattern. Another metallization layer 54 also is shown.

Metallization layer 54 is disposed between metallization layer 50 and GC pads 18. Metallization layer 54 accommodates contacts 24 by passing around these contacts. For 4F2 cells, contacts 24 are isolated from metal lines 54 by depositing a thin isolating liner after the contact holes are etched. This type of contact is called a borderless contact, because it does not need a border around the contact. Isolation is provided by the distance between the lithographic features of the metallization mask for metal lines 54 and the contacts 24. Metallization layer 54 connects to contacts 16 as described above. In one embodiment, metallization layer 54 is an M0 layer and has metal lines 52 acting as wordlines while metallization layer 50 is an M1 layer having metal lines 56 acting as bitlines. Metal lines 56 may be in a zig-zag pattern or in a straight pattern.

Figure 6:
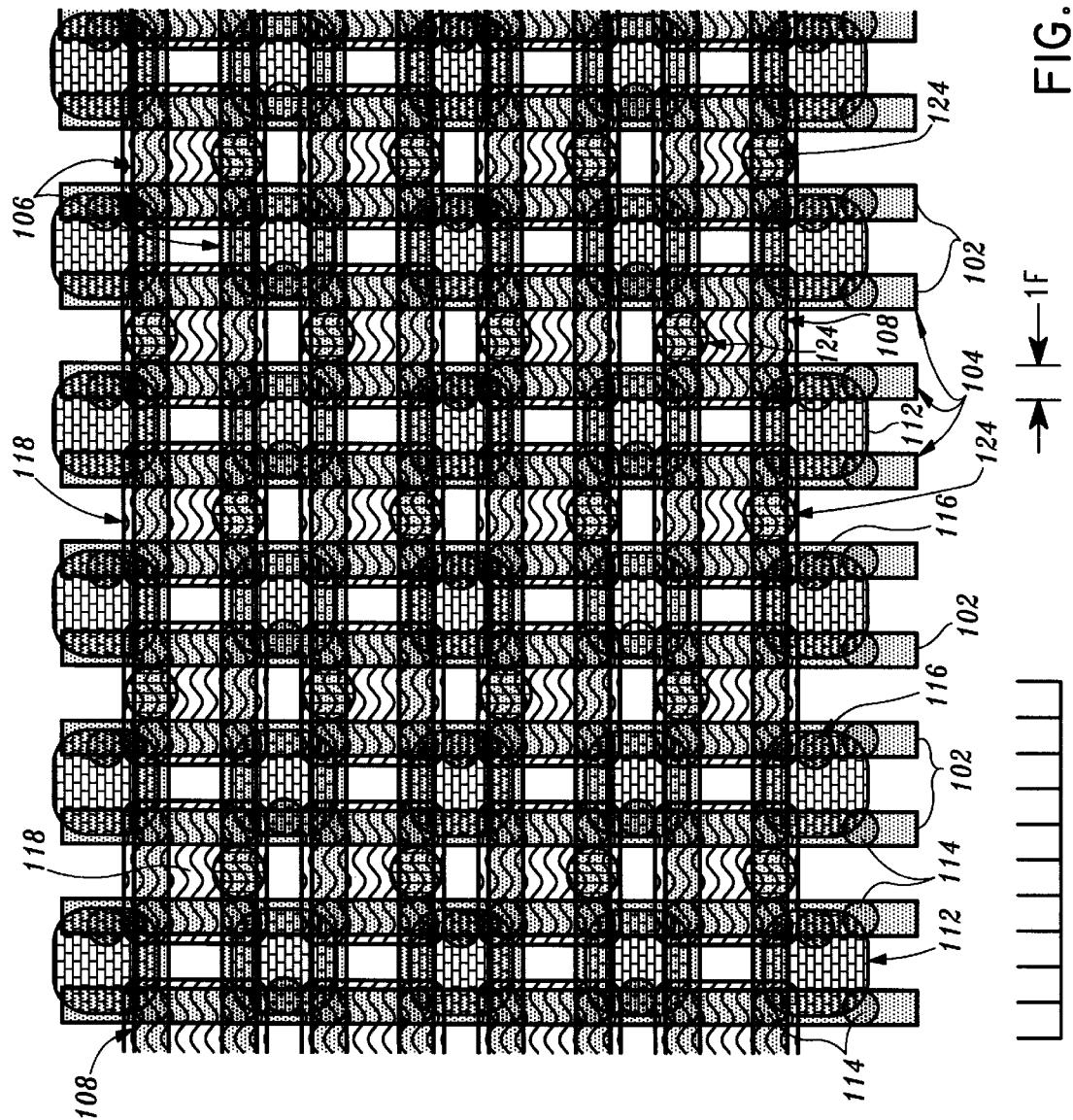
FIG. 6 is the layout of FIG. 5 showing an embodiment having a larger memory cell area in accordance with the present invention.

Referring to FIG. 6, another embodiment of the present invention is shown. FIG. 6 shows a $6F^2$ layout pattern. Other cell areas are also contemplated. This provides more room for contacts 116 between active areas 112 to metal lines 102 in metallization layer 104. Metallization layer 104 is preferably layer M0. In this way bordered contacts may be used for contacts 116. This embodiment is more compatible with prior art vertical and planar transistor cells. Deep trenches 114 are preferably circular and include a minimum feature size diameter.

Due to this layout, metallization layer 104 is afforded greater space to accommodate contacts 124 to a metallization layer 106. Metallization layer 106 includes metal lines 108 which connect to contacts 124. Contacts 124, in turn, connect to GC pads 118. Metal lines 102 and 108 may be straight as shown or zig-zagged (not shown).

In this layout, metal lines 102 and 108 are straight and contacts 116 are offset from the center of active area pads 112. Contacts 124 are offset to the center of GC pads 118. In this example, the requirements for the lithographic pattern density for metal lines 102 and 108 are more relaxed compared to the zig-zag pattern.

In accordance with the present invention as illustrated buy the non-limiting embodiments shown, even space distribution is provided between deep trenches 114. This avoids microloading effects (i.e., the reduced etch rate for a feature due to etchant depletion because of close proximity to neighboring features to be etched) during etching of the deep trenches 114. The present invention permits minimum widths and/or space sizes for active areas and GC pads to be larger than the minimum feature size. The present invention also provides a substantially equal distribution of wordline and bitline pitch. It is to be understood that the bitlines are generally associated with M1 metallization while wordlines are generally associated with the M0 metallization as described for the various embodiments, although this may be switched. The present invention avoids the need for features (shape widths and shape distances) on lithographic masks that are below the printable minimum feature size (F) even for $4F^2$ area cells.

Having described preferred embodiments for a novel layout and wiring scheme for memory cells with vertical transistors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A memory device having vertical transistors comprising:
    an active area pad isolated from adjacent active area pads on all sides, the active area pad having a set of trench capacitors associated therewith, the set of trench capacitors being coupled to the active area pad through vertical transistors, the active area pad being configured to connect the set of trench capacitors to a first contact; and
    a gate conductor pad disposed between a set of active area pads and adapted to activate vertical transistors in each active area pad adjacent to the gate conductor pad, each gate conductor pad being activated by a second contact such that when the gate conductor pad is activated through the second contact, the vertical transistors in each active area pad conduct to provide access to the trench capacitors and transfer a state between the first contact and the trench capacitors.

2. The device as recited in claim 1, wherein the active area pads and the gate conductor pad are one of square, circular and triangular in shape.

3. The device as recited in claim 1, wherein the first contact connects to a first metallization layer and the second contact connects to a second metallization layer.

4. The device as recited in claim 3, wherein the first metallization layer includes first metal lines and the second metallization layer includes second metal lines wherein the first metal lines and the second metal lines have a substantially equal pitch.

5. The device as recited in claim 3, wherein the first metallization layer includes first metal lines and the second metallization layer includes second metal lines wherein the first metal lines and the second metal lines each are disposed in a zig-zag pattern.

6. The device as recited in claim 1, wherein the active area pads and the gate conductor pads are disposed in a checkerboard pattern.

7. The device as recited in claim 1, wherein the first contact is connected to a bitline and the second contact is connected to a wordline.

8. The device as recited in claim 1, wherein the device is divisible into memory cells such that the memory cells have an area of one of about $4F^2$ and about $6F^2$.

9. A semiconductor memory having vertical access transistors comprising:
    a substantially square active area pad having a trench capacitor formed at each corner of the active area pad, the trench capacitors being coupled to the active area pad through vertical transistors, the active area pad being configured to connect the trench capacitors to a first contact when the vertical transistors are conducting; and
    a substantially square gate conductor pad disposed between four active area pads such that corners of the gate conductor pad overlap adjacent corners of the four active area pads, the gate conductor pad adapted to activate one vertical transistor corresponding to the corner of each active area pad overlapped by the gate conductor pad, the gate conductor pad being activated by a second contact such that when the gate conductor pad is activated through the second contact the one vertical transistor in each active area pad conducts to provide access to the trench capacitors and to transfer a state between the first contact and the trench capacitors.

10. The memory as recited in claim 9, wherein the first contact connects to a first metallization layer and the second contact connects to a second metallization layer.

11. The memory as recited in claim 10, wherein the first metallization layer and the second metallization layer have a substantially equal pitch.

12. The memory as recited in claim 10, wherein the first metallization layer and the second metallization layer each are disposed in a zig-zag pattern.

13. The memory as recited in claim 9, wherein the active area pads and the gate conductor pads are disposed in a checkerboard pattern.

14. The memory as recited in claim 9, wherein the first contact is connected to a bitline and the second contact is connected to a wordline.

15. The memory as recited in claim 9, wherein the memory is divisible into memory cells such that the memory cells have an area of one of about $4F^2$ and about $6F^2$.

16. A semiconductor memory having vertical access transistors comprising:
    a plurality of substantially square active area pads, each having a trench capacitor formed at each corner of the active area pad, the trench capacitors being coupled to the active area pad through vertical transistors, the active area pad being configured to connect the trench capacitors to a first contact when the vertical transistors are conducting;
    a plurality of substantially square gate conductor pads, each being disposed between four active area pads to form a checkerboard pattern between the gate conductor pads and the active area pads, each of the gate conductor pads having corners overlapping adjacent corners of the four active area pads, each corner of the gate conductor pad adapted to activate one vertical transistor corresponding to the corner of each active area pad overlapped by the gate conductor pad, each gate conductor pad being activated by a second contact such that when the gate conductor pad is activated through the second contact the one vertical transistor in each active area pad conducts to provide access to the trench capacitors and to transfer a state between the first contact and the trench capacitors;

a first metal layer connecting to the first contacts for providing the state; and a second metal layer vertically spaced apart from the first metal layer, the second metal layer connecting to the second contacts for activating the gate conductor pads.

17. The memory as recited in claim 16, wherein the first metal layer and the second metal layer have a substantially equal pitch.

18. The memory as recited in claim 16, wherein the first metal layer and the second metal layer each are disposed in a zig-zag pattern.

19. The memory as recited in claim 16, wherein the first metal layer includes bitlines and the second metal layer includes wordlines.

20. The memory as recited in claim 16, wherein the memory is divisible into memory cells such that the memory cells have an area of one of about $4F^2$ and about $6F^2$.

\* \* \* \* \*